United States Patent
Cirelli et al.

(10) Patent No.: US 6,251,546 B1
(45) Date of Patent: Jun. 26, 2001

(54) METHOD OF FABRICATING DEVICES USING AN ATTENUATED PHASE-SHIFTING MASK AND AN ATTENUATED PHASE-SHIFTING MASK

(75) Inventors: Raymond Andrew Cirelli, Hillsborough; Omkaram Nalamasu, Bridgewater; Stanley Pau, North Plainfield; George Patrick Watson, Avon, all of NJ (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/397,716

(22) Filed: Sep. 16, 1999

(51) Int. Cl.$^7$ .................................................. G03F 9/00
(52) U.S. Cl. .................................................................. 430/5
(58) Field of Search ............................... 430/5, 322, 394; 359/500.22

(56) References Cited

U.S. PATENT DOCUMENTS

| | | | |
|---|---|---|---|
| 5,340,700 | 8/1994 | Chen et al. | 430/312 |
| 5,424,153 | * 6/1995 | Asai | 430/5 |
| 5,503,951 | 4/1996 | Flanders et al. | 430/5 |
| 5,536,602 | * 7/1996 | Nakao | 430/5 |
| 5,604,060 | * 2/1997 | Miyashita et al. | 430/5 |
| 5,766,806 | 6/1998 | Spence | 430/5 |
| 5,783,337 | 7/1998 | Tzu et al. | 430/5 |
| 5,795,682 | 8/1998 | Garza | 430/5 |

OTHER PUBLICATIONS

Fujimoto, et al. , "Comparison between optical proximity effect of positive and negative tone paterns in KrF lithography", SPIE vol. 3051, pp. 739–750.

McCord, et al., "Effect of mask absorber thickness on X–ray exposure latitude and resolution", J. Vac. Sci, Tech. B 11(G), pp. 2881–2887, Nov./Dec. 1993.

* cited by examiner

Primary Examiner—S. Rosasco
(74) Attorney, Agent, or Firm—Cohen, Pontani, Lieberman & Pavane

(57) ABSTRACT

An improved attenuated phase-shifting mask (APSM) for use with an imaging tool for forming a patterned feature on a photoresist layer of a semiconductor wafer. The APSM has a transmissive region for substantially transmitting light therethrough to form a projected image substantially shaped as the patterned feature on the photoresist layer. The APSM also has an attenuating and phase-shifting region, contiguous with the transmissive region, for absorbing a portion of the light incident thereon and for shifting the phase of the incident light by a predetermined number of degrees relative to that of the light transmitted through the transmissive region so as to destructively interfere with the light transmitted through the transmissive region and to project a background image. The transmissive region has a dimension d dimensioned such that the intensity of the image projected by the transmissive region is darker than the intensity of the background image projected by the attenuating and phase-shifting region of the mask and that the intensity of the background image is substantially uniform.

15 Claims, 4 Drawing Sheets

METHOD OF FABRICATING DEVICES USING AN ATTENUATED PHASE-SHIFTING MASK AND AN ATTENUATED PHASE-SHIFTING MASK

BACKGROUND OF THE INVENTION

1. Field of the Invention

The present invention relates to optical lithography and, more particularly, a method for patterning subwavelength circuit features in a resist coated semiconductor wafer using phase-shifting mask techniques.

2. Description of the Related Art

As consumers demand more compact and more powerful electronic devices, manufacturers must fabricate ever smaller and denser integrated circuits. Heretofore, manufacturers have employed photolithographic techniques, i.e. techniques that utilize light (e.g. ultraviolet rays or monochromatic light), to pattern miniature circuit features such as, for example, gate electrodes, contacts, vias, metal interconnects, etc. in a substrate.

Photolithography involves the projection of a patterned image onto a coating or layer of photoresist (i.e., a radiation sensitive material) on a semiconductor wafer using an imaging tool and a photomask having a desired pattern thereon. After exposure, the resist-coated wafer is soaked in a developing solution so as to reproduce the imaged pattern. Depending on the particular type of photoresist (e.g., a positive or negative photoresist), a positive or a negative image of the pattern of the photomask is developed in the photoresist layer. For example, if a negative-tone resist is used, then the projected radiation passing through the photomask will cause the exposed areas of the photoresist to undergo polymerization and cross-linking. Upon subsequent development, unexposed portions of the photoresist will wash off with the developer, leaving a pattern of resist material constituting a reverse or negative image of the mask pattern. On the other hand, if a positive-tone resist is used, the radiation passing through the mask will cause the exposed portions of the resist layer to become soluble in a developer, thereby leaving a pattern that corresponds directly or positively to the transparent portions of the mask pattern. In either case, the remaining resist material will undergo subsequent processing steps such as, for example, etching and deposition to form the desired semiconductor devices.

To produce subwavelength circuit features, e.g., features smaller than the wavelength of the exposure radiation, manufacturers employ a photolithographic technique known as the phase-shifting mask technique. The phase-shifting mask technique uses a mask having a region that allows transmission of light therethrough and an adjacent region that shifts the phase of the light or radiation travelling therethrough by about 180 degrees relative to that of the incident light. In theory, this 180 degree phase difference causes destructive interference of light from the two regions along their interface to thereby enhance contrast of the projected image.

There are many variations to the phase-shifting mask technique, one common variation uses an attenuated phase-shifting mask (APSM). The APSM is typically made of a quartz substrate having a transmnissive region for transmitting light therethrough and an attenuating, phase-shifting region (i.e., an absorber) that absorbs or attenuates a portion of the incident light while phase-shifting and transmitting a remaining portion of the light therethrough. The absorber is typically formed of a transmittance controlling layer and a phase-shifting layer; optionally, the absorber may be formed of a single layer that performs both of these functions. The absorber may be made of molybdenum silicide oxynitride (MoSiON), chromium oxynitride (CrON), or chromium fluoride (CrF) with such thickness that allows about 5–15% light transmittance. In use, a mask or reticle (having a magnification such as, for example, 4×) is placed in a "stepper" that automatically and incrementally moves and exposes different portions of the wafer to form patterned images on the wafer. The patterned images in the photoresist are then developed into patterns by immersing the photoresist in a developing solution.

A major drawback of prior art APSM techniques is the destructive interference between the phase-shifted light and the non-phase-shifted light along the edge of the patterned image (in the image plane). This results in an intensity profile (i.e. intensity as a function of position in the image plane) that has "side lobes" (i.e., secondary lobe peak intensities) along the edge of the patterned image. In other words, the phase-shifted and the non-phase-shifted light interact along the edge of the patterned image such that there are regions of light with intensities that are significantly different from the background. An image with an intensity profile having sufficiently large side lobes could be developed into a pattern that has "ring" structures around the pattern features. The presence of such ring structures can degrade the intended shapes of the features and would thus prevent the printing of denser circuitry.

There is thus a need for an improved APSM process that significantly reduces or eliminates side lobes in the intensity profile along the edge of a patterned image.

SUMMARY OF THE INVENTION

An object of the invention is to provide an improved photolithographic method of forming an enhanced image of a subwavelength circuit feature on a radiation or light sensitive layer of a semiconductor wafer.

Another object of the invention is to provide an improved attenuated phase-shifting mask for printing subwavelength features.

According to one aspect of the invention, the improved attenuated phase-shifting mask has a transmissive region dimensioned such that the light transmitted therethrough is substantially destructively interfered by phase-shifted light traveling through an attenuating, phase-shifting region adjacent thereto. So constructed, the transmissive region projects an image that has an intensity that is less than the intensity of the background image projected by the attenuating, phase-shifting region. The transmissive region has a dimension d that is selected so that the image of the transmissive region that is projected into the image plane is a dark-field image. The dark field image results from the destructive interference of the light projected onto the transmissive region. The intensity of the image of the transmissive region in the image plane is less than the intensity of the radiation transmitted through the attentuated phase-shifting region contiguous to the transmissive region. Consequently, the intensity of the image of the transmissive region is less than the intensity of the background image.

According to another aspect of the invention, the improved method includes the step of transmitting light through the inventive attenuated phase-shifting mask to project the dark-field image on a negative-tone photoresist so as to form a subwavelength circuit feature in the photoresist. A subwavelength feature is a feature with a dimension that is less than the wavelength of the exposure radiation.

An advantage of the present invention is that subwavelength circuit features can be defined with greater precision because the intensity profile of the image projected by the attenuated phase-shifting mask is substantially free of edge-blurring side lobes thereby enabling manufacturers to produce denser circuitry than is possible with prior art techniques.

A preferred embodiment of an improved photolithographic method of forming a patterned feature on a semiconductor wafer includes the use of an imaging tool to emit and focus light of a wavelength λ. A semiconductor wafer having a photoresist layer that is responsive to the light from the imaging tool is positioned along a propagation path of the light from the imaging tool, so that at least a portion of the light is incident on the photoresist layer. The method also includes positioning along the propagation path of the light from the imaging tool an attenuated phase-shifting mask for projecting an image onto the photoresist layer. Preferably, the mask has a transmissive region for substantially transmitting the light therethrough to form a projected image substantially shaped as the patterned feature on the photoresist layer and an attenuating and phase-shifting region, contiguous with the transmissive region, for absorbing a portion of the light incident thereon and for shifting the phase of a remaining portion of the incident light by a predetermined number of degrees relative to that of the light transmitted through the transmissive region, so as to destructively interfere with the light transmitted through the transmissive region and to project a background image. The transmissive region has a dimension d dimensioned such that each portion of the intensity of the image projected by the transmissive region is less than the intensity of the background image projected by the attenuating and phase-shifting region of the mask and that the intensity of the background image projected by the attenuating and phase shifting region of the mask is substantially uniform.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

In the drawings wherein like reference numerals denote similar elements throughout the views.

DETAILED DESCRIPTION OF THE PRESENTLY PREFERRED EMBODIMENTS

Figure 1:
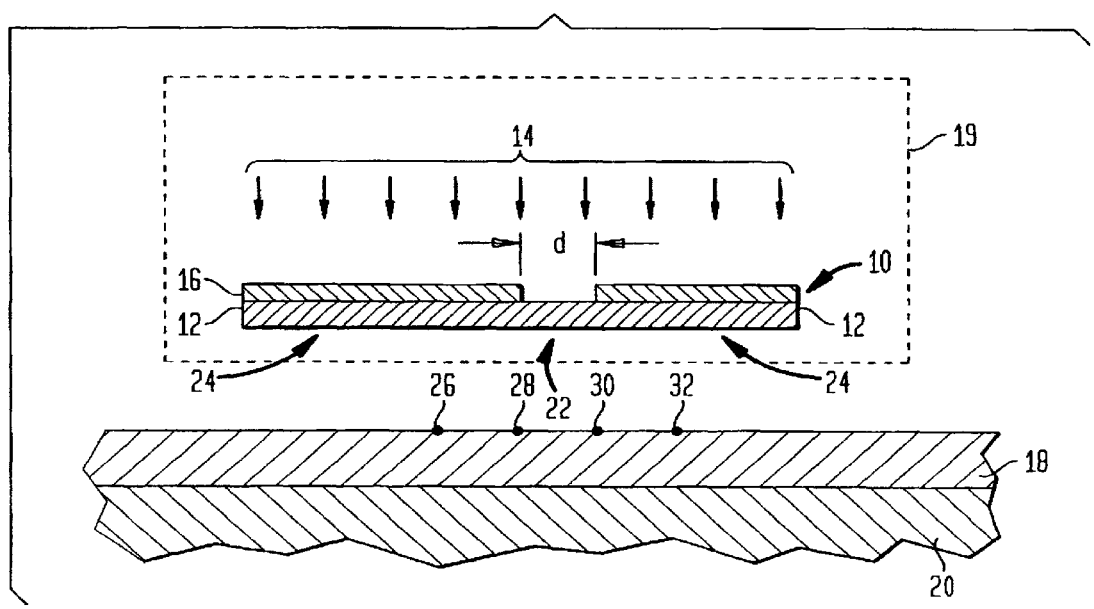
FIG. 1 is a cross-sectional side view of an embodiment of the attenuated phase-shifting mask and a semiconductor substrate in accordance with the present invention.

FIG. 1 is a cross-sectional side view of an attenuated phase-shifting mask 10 constructed in accordance with the present invention. The mask 10 includes a light-transmissive substrate 12 capable of transmitting light (including visible and invisible spectrum, such as ultraviolet rays) 14, without any significant absorption or phase-shifting (e.g., unity transmissivity). The mask 10 also includes a layer of attenuating and phaseshifting material 16 (e.g. a metal or metal oxide), deposited on a portion of the substrate 12, which attenuates and shifts the phase of the light traveling therethrough. This phase-shifting phenomenon is well understood in the art and thus will not be explained in detail here. The light absorbing material 16 is selected based on parameters such as, for example, its refractive index, wavelength absorption property, and thickness such that the phase of the light transmitted therethrough is shifted from that of the light transmitted through the substrate 12. The phase shift is preferably about 180 degrees but may be any angle between 0 and 360 degrees such as, for example, between about 160 and about 200 degrees. As depicted, the mask 10 is placed in a known imaging tool 19 (e.g. a Nikon S201 "stepper") that emits radiation or light of a preselected wavelength λ at a selected dosage (i.e., energy per unit area) toward the mask 10 and focuses the image projected by the mask 10 onto a photoresist layer 18 on a semiconductor wafer 20. As is well known in the art, the mask 10 and the patterns formed thereon may be constructed at a predetermined magnification (M) (e.g., 2×, 5× etc.) of the to-be-printed circuit features for ease of manufacturing the mask, which magnification is taken into account by the imaging tool 19 when projecting a patterned image of appropriately sized circuit features. Typically, a particular stepper determines the magnification of the mask to be used since the magnification of the stepper is fixed.

In a preferred embodiment, the mask 10 includes a light-transmissive substrate made of quartz and a layer 16 of attenuating and phase-shifting material consisting of $CrF_x$ (e.g., x =1 or 2.5) and Cr (or alternatively, MoSiON or CrON) deposited thereon. A transmissive region 22 having a dimension d is defined in the attenuating and phase-shifting layer 16 by forming an opening therein to thereby expose a portion of the light-transmissive substrate 12. The opening may, for example, be a circle, a rectangle, a square, or any other shape or pattern. Advantageously, the transmissive region 22 of the mask 10 is dimensioned such that the light propagating therethrough is substantially and destructively interfered by the light transmitted through the adjacent attenuating and phase-shifting region 24 comprising the light transmissive-substrate 12 and the attenuating and phase-shifting layer 16. As a result, the mask 10 produces on the photoresist 18 a dark-field projected image shaped by the transmissive region 22 and a light background image patterned by the attenuating and phase-shifting region 24 of the mask 10 that has an intensity greater than the intensity of the dark-field projected image.

The dimension d of the transmissive region 22 is selected based on the wavelength λ (e.g. between about 157 nm and about 248 nm) of the exposure radiation (i.e. the source light or radiation) and the transmittance of the attenuating and phase-shifting region 24. Preferably, the dimension d is less than the product of the magnification of the mask 10 and the wavelength λ. As discussed below, the dark-field image projected by the transmissive region 22 may be advantageously used to provide a high contrast image of a subwavelength circuit feature because the image-blurring side lobes in the intensity profile typically associated with prior art APSM processes are substantially reduced or eliminated.

Figure 2A:
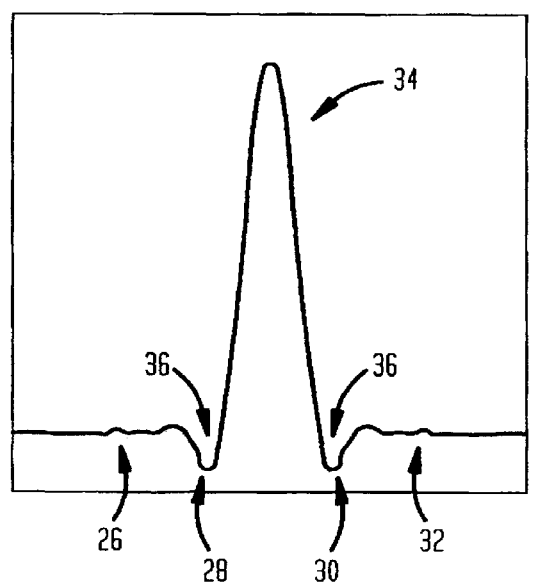
FIG. 2A illustrates a light intensity curve for an APSM having a transmissive region larger than the product of the wavelength of the exposure radiation and the magnification of the APSM.
Figure 2B:
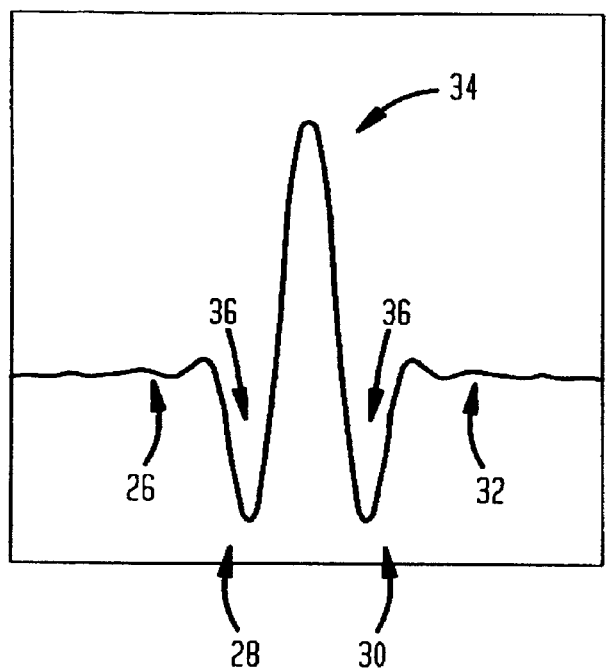
FIG. 2B illustrates a light intensity curve for an APSM having a transmissive region smaller than the product of the wavelength of the exposure radiation and the magnification of the APSM.
Figure 2C:
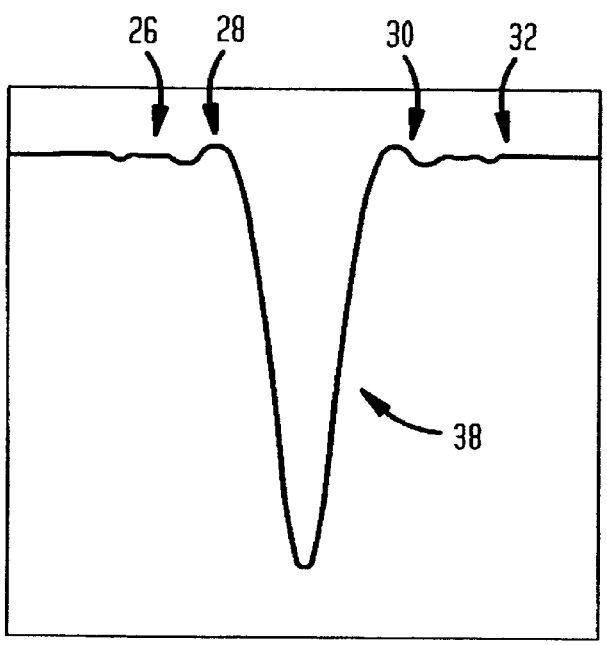
FIG. 2C illustrates a light intensity curve for a preferred embodiment of an APSM having a transmissive region smaller than that of the embodiment of FIG. 2B and dimensioned to project a dark image.

FIGS. 2A–2C demonstrate the effects that a dimension d of the transmissive region has on the light intensities of a projected image along points 26, 28, 30, and 32 in the image plane (on the photoresist 18) as depicted in FIG. 1. Points 26 and 32 are located in the background image and points 28 and 30 positioned at or near the edge of the projected image of the transmissive region. In FIG. 1, the location of the points and the distances therebetween, the width and the thicknesses of the various layers of the mask 10 are not necessarily drawn to scale. FIG. 2A illustrates a light intensity curve for a projected image formed by a transmissive region where the dimension d is large relative to the wavelength λ of the exposure radiation for unity magnification (i.e., d is greater than or substantially equal to the wavelength λ of the exposure radiation, as in prior art techniques). As can be seen, the image intensity curve has a positive central peak 34 representing an area of bright light (i.e. a bright-field image) relative to that of the background image (i.e., at points 26 and 32) patterned by the attenuating and phase-shifting region 24. Also formed in the intensity profile that corresponds to the edge of the projected image are side lobes 36. This is the region wherein destructive interference between the light projection from transmissive region 22 and attenuating and phase shifting region 24 occurs. The side lobes 36 may also be described as regions having "negative" peak intensities because their light intensities are lower than those of the background image. The intensity of the light in this side lobe region is different than the intensity of light in the portion of the profile that corresponds to the background region and the peak intensity of the portion of the profile that corresponds to the imaged region. For an isolated feature, the intensity profile illustrated in FIG. 2A is adequate (i.e. an acceptable feature will be developed from an image with such an intensity profile). However, as individual features are placed closer together, the image blurring effects of the intensity profile side lobes from adjacent features become cumulative. The cumulative effect is more likely to adversely affect the developed feature.

FIG. 2B shows an intensity curve of an image projected by a transmissive region 22 having a smaller dimension d than that of FIG. 2A. The difference in intensity in the side lobe region can cause the portion of the image that corresponds to the side lobe region to develop differently than the rest of the background region and the imaged region (the imaged region being the portion of the image that is projected from the transmissive region in the mask). As previously noted, if the portion of the image that corresponds to the side lobe region of the intensity profile develops differently, the resulting pattern is adversely affected.

In both FIGS. 2A and 2B, the side lobes located at the edges of the positive central peak 34 in the intensity profile result in fuzziness of the image projected by the transmissive region 22. The pattern that is developed from this fuzzy image is not desirable. Furthermore, the side lobes 36 are larger in FIG. 2B than in the side lobes 36 FIG. 2A. Thus, as the dimension d gets smaller, the side lobes 36 increase in size. Therefore, the contrast problems associated with side lobes 36 increase with decreasing dimension d.

FIG. 2C illustrates a preferred embodiment of the present invention wherein the dimension d of the transmissive region 22 is sized such that the intensity of the background region (i.e. the region contiguous with the imaged region) is substantially uniform. That is the contrast between the side lobe region and the background region of the intensity profile is negligible. In the intensity profile depicted in FIG. 2C, the image projected by this transmissive region 22 is dark relative to the background image. This embodiment advantageously produces a projected image that has virtually no image-blurring side lobes along the edge of the projected image. This phenomenon is believed to be the result of substantial interference or cancellation of the light transmitted through the transmissive region by the phase-shifted light transmitted through the attenuating, phase-shifting region 24 of the mask 10.

The desired dimension d for the transmissive region 22 may be readily obtained by computing and/or plotting, for example, normalized spatially-integrated image intensity ($I_N$) given an exposure radiation wavelength λ for a range of d values and a set of transmittance values of the attenuating and phase-shifting region 24. Such computation and plotting may be performed using well-known analytical tools such as, for example, SPLAT. The normalized spatially-integrated image intensity, as shown in FIG. 3, is defined as the difference between the total intensity of a projected image and the total intensity of a background image.

Figure 3:
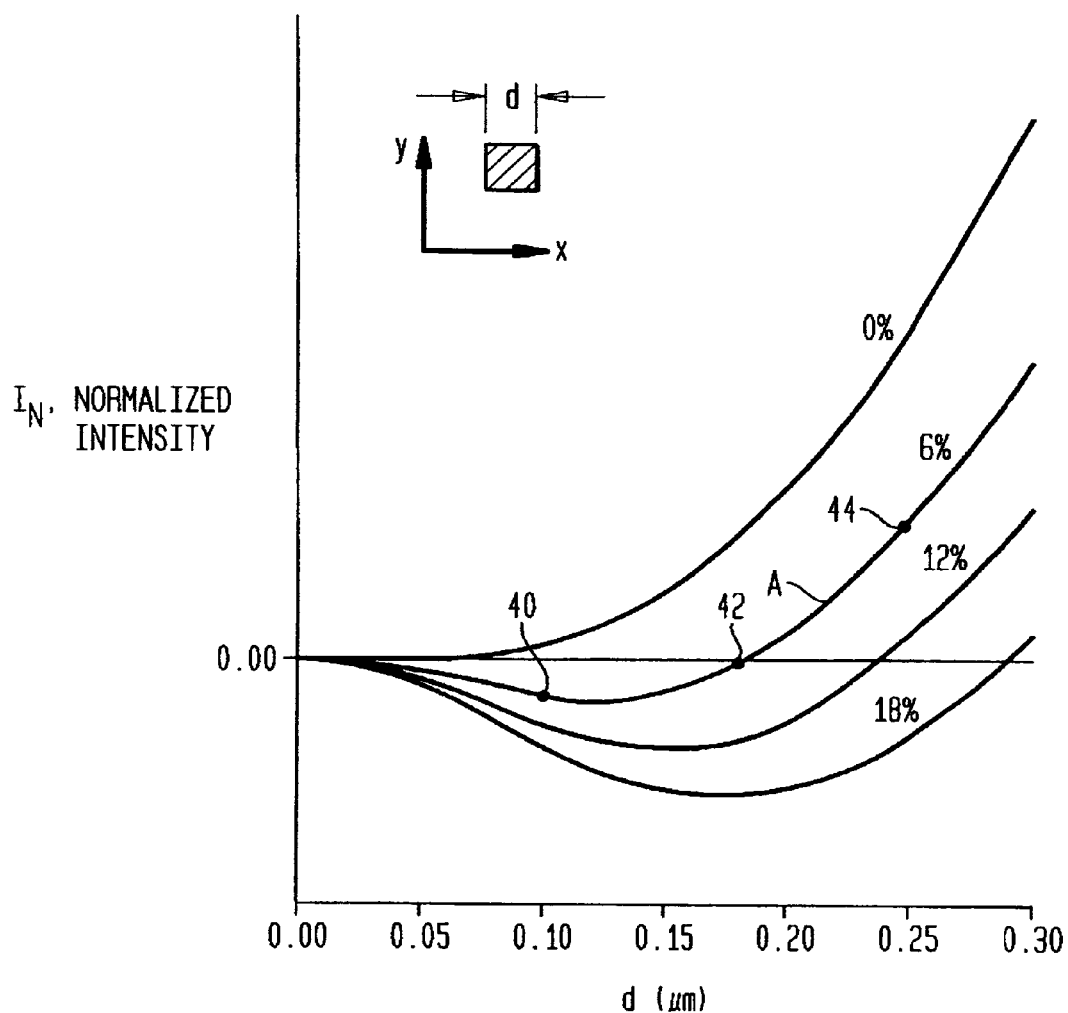
FIG. 3 depicts normalized intensity curves for a substantially square-shaped transmissive region.

FIG. 3 illustrates the computational results for a substantially square-shaped transmissive region for a set of transmittance values of the attenuating and phase-shifting region 24. As shown, the effect of the variations of d on $I_N$ is plotted for transmittance values of 0%, 6%, 12%, and 18% with a preselected wavelength λ (e.g. 248 mm). Each $I_N$ curve in FIG. 3, corresponding to a particular transmittance value, has a minimum point (i.e., the point where the slope is zero) at which the projected image area is darkest relative to the background image, i.e. the contrast between the projected image and the background image is at its maximum. Therefore, by identifying the minimum point of a relevant $I_N$ curve, one can readily arrive at an optimal width d for the transmissive region 22 (which curve is calculated based on an exposure wavelength λ of the incident light, magnification factor of the mask 10, phase-shift of the incident light, and/or transmittance value of the attenuating and phase-shifting region 24). For example, curve A of FIG. 3, for transmittance value of 6%, shows a minimum point at point 40 corresponding to d=0.10 μm. Thus, for an imaging system with unity magnification, the desired dimension for the transmissive region 22 of this embodiment is 0.10 μm according to the present invention. The light intensity curve for this configuration would be similar to that shown in FIG. 2C. If, however, point 42 is selected, corresponding to d=0.18 μm, it would be expected that the light intensity curve will be similar to that shown in FIG. 2B. On the other hand, if point 44 is selected, corresponding to d=0.25 μm, the light intensity curve for the projected image will be similar to that of FIG. 2A.

In a particularly preferred embodiment, the inventive APSM is used in conjunction with a negative photoresist such that dark, rather than bright, image areas projected by the transmissive regions are later developed into circuit features.

Figure 4:
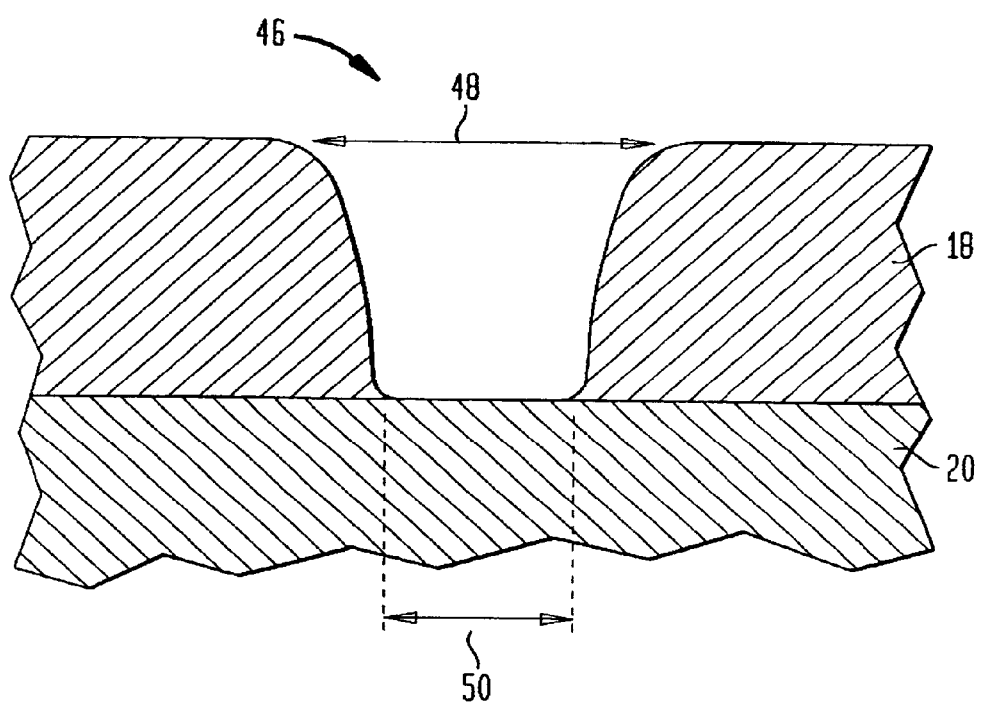
FIG. 4 schematically shows a contact hole produced in a photoresist layer in accordance with the present invention.

To demonstrate feasibility of the present invention, a 4× mask (or reticle) was made of a quartz substrate with 140 nm films of $CrF_x$ and Cr formed thereon. The 4× mask had a 560 nm (i.e. 0.56 μm) wide transmissive region for forming a 140 nm image area on an image plane (i.e. the photoresist), and the photoresist that is sensitive to 248 nm provided a mean phase-shift of about 180.6 degrees and transmittance of about 5.89%, with standard deviations of 2.6 degrees and 0.16% respectively. Nikon S201 stepper was used as the imaging tool for exposure at a numerical aperture of 0.6 and a sigma of 0.4. For image transfer, a negative UVN30 photoresist having a thickness of 380 nm with a 60 nm AR3 antireflection coating (ARC) was used. The optimal exposure dose was found to be about 270 mJ/cm$^2$, a relatively high value. However, it is noted that a mask with a transmittance higher than 6% would require considerably less dose. Based on the above parameters, it was found that holes in the photoresist layer were successfully produced such as hole 46 having a top diameter 48 and a bottom diameter 50, as shown schematically in FIG. 4. In one example, the hole 46 had a top diameter of about 200 nm and a bottom diameter of about 156 nm.

Thus, while fundamental novel features of the invention have been shown and described and pointed out as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

We claim:

1. A photolithographic method of forming a patterned feature on a semiconductor wafer, comprising the steps of:
   (a) positioning along a propagation path of light from an imaging tool a semiconductor wafer having a photoresist layer that is sensitive to light having a wavelength λ from the imaging tool, so that at least a portion of the light is incident on the photoresist layer;
   (b) positioning along the propagation path of the light from the imaging tool an attenuated phase-shifting mask so as to project an image onto the photoresist layer, the mask having a transmissive region for substantially transmitting the light therethrough to form a projected image substantially shaped as the patterned feature in the photoresist layer and an attenuating and phase-shifting region, contiguous with the transmissive region, for absorbing a portion of the light incident thereon and for shifting the phase of the light incident thereon relative to that of the light transmitted through the transmissive region so as to destructively interfere with the light transmitted through the transmissive region and to project a background image, the transmissive region having a dimension d dimensioned such that the intensity of the image projected by the transmissive region is less than the intensity of the background image projected by the attenuating and phase-shifting region of the mask and that the intensity of the background image is substantially uniform; and
   (c) selectively emitting the light from the imaging tool at a predetermined dosage and focusing the image projected by the transmissive region onto the photoresist layer.

2. The method of claim 1, wherein the mask is constructed at a predetermined magnification and the dimension d of the transmissive region is dimensioned less than the product of the wavelength λ and the predetermined magnification.

3. The method of claim 1, further comprising the step of dimensioning the transmissive region by calculating a dimension d so as to provide a dark field image of the transmissive region and a background image of substantially uniform intensity contiguous with the dark-field image based on at least one of the wavelength λ of the incident light, phase-shift of the incident light through the attenuating and phase-shifting region, transmittance value of the attenuating and phase-shifting region, and magnification of the attenuated phase-shifting mask.

4. The method of claim 1, further comprising after step (c) the step of (d) developing the photoresist to reproduce the projected image in the photoresist so as to form the patterned feature.

5. The method of claim 1, wherein step (c) further comprises the step of configuring the attenuating and phase-shifting region to shift the phase of the incident light by about 160 to about 200 degrees.

6. The method of claim 5, wherein the attenuating and phase-shifting region is configured to shift the phase of the incident light by about 180 degrees.

7. The method of claim 1, wherein in step (a) the wavelength λ is between about 157 and 248 nm.

8. The method of claim 1, wherein the transmissive region has substantially a square shape.

9. An attenuated phase-shifting mask for use with an imaging tool in a semiconductor fabrication process and having a predetermined magnification of a patterned feature to be formed in a photoresist of a semiconductor wafer, comprising:
   a transmissive region capable of transmitting light of a wavelength λ therethrough to form a projected image; and
   an attenuating phase-shifting region, contiguous with the transmissive region, for absorbing a portion of the light incident thereon and for shifting the phase of the incident light transmitted therethrough relative to that of the light transmitted through the transmissive region, the transmissive region having a dimension d dimensioned less than the product of the predetermined magnification and the wavelength λ such that the intensity of the image projected by said transmissive region is less than the intensity of a background image projected by the attenuating and phase-shifting region and that the intensity of the background image is substantially uniform.

10. The attenuated phase-shifting mask of claim 9, wherein the dimension d of the transmissive region is determined so as to provide a dark-field image of the transmissive region and a background image of substantially uniform intensity contiguous with the dark-field image based on at least one of the wavelength λ of the incident light, phase-shift of the incident light through the attenuating and phase-shifting region, transmittance value of the attenuating and phase-shifting region, and magnification of the attenuated phase-shifting mask.

11. The attenuated phase-shifting mask of claim 10, wherein the transmissive region comprises a portion of a quartz substrate.

12. The attenuated phase-shifting mask of claim 11, wherein the attenuating and phase shifting region comprises a layer of $CrF_x$ and Cr on another portion of said quartz substrate.

13. The attenuated phase-shifting mask of claim 9, wherein the transmissive region has substantially a square shape.

14. A method of producing a transmissive region in a phase shift optical mask, wherein an exposure radiation wavelength is $\lambda$, and wherein an attenuating phase shifting region of the phase shift optical mask has a transmittance value, comprising the steps of:

computing image intensity, given wavelength $\lambda$ and the transmittance value, over a range of d values, said d values being different widths of the transmnissive region to be produced;

selecting a certain d value by identifying a minimum computed image intensity; and forming the transmissive region with a width equal to the selected certain d value; whereby a dark-field image will be produced by the formed transmissive region in the phase shift optical mask.

15. A phase shift optical mask, comprising:

a transmnissive region for transmitting therethrough light of a wavelength $\lambda$ to form a projected image, wherein said transmissive region has a width d; and an attenuating phase-shifting region, contiguous with the transmissive region, for absorbing a portion of light incident thereon and for shifting a phase of the incident light relative to a phase of the light of wavelength transmitted through the transmissive region, wherein said attenuating phase shifting region has a transmittance value;

wherein the width d is selected such that an image intensity of the projected image is a minimum for the transmittance value.

* * * * *